(12) United States Patent
Ou et al.

(10) Patent No.: US 9,608,162 B2
(45) Date of Patent: *Mar. 28, 2017

(54) LIGHT-EMITTING DEVICE HAVING A PATTERNED SURFACE

(71) Applicant: EPISTAR CORPORATION, Hsinchu (TW)

(72) Inventors: Chen Ou, Hsinchu (TW); Chiu-Lin Yao, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/997,258

(22) Filed: Jan. 15, 2016

(65) Prior Publication Data

US 2016/0133789 A1    May 12, 2016

Related U.S. Application Data

(63) Continuation of application No. 14/132,819, filed on Dec. 18, 2013, now Pat. No. 9,257,604, which is a (Continued)

(30) Foreign Application Priority Data

Dec. 24, 2008    (TW) ............................... 97150633 A

(51) Int. Cl.
*H01L 33/20*    (2010.01)
*H01L 33/22*    (2010.01)
*H01L 33/24*    (2010.01)

(52) U.S. Cl.
CPC .............. *H01L 33/20* (2013.01); *H01L 33/22* (2013.01); *H01L 33/24* (2013.01); *H01L 2933/0091* (2013.01)

(58) Field of Classification Search
None
See application file for complete search history.

(56) References Cited

U.S. PATENT DOCUMENTS 6,091,083 A    7/2000  Hata et al.
6,232,623 B1   5/2001  Morita
(Continued)

FOREIGN PATENT DOCUMENTS

CN       1812144       8/2006

OTHER PUBLICATIONS

Definition of polygon downloaded from URL <http://www.meriam-webster.com/dictionary/polygon> on Apr. 30, 2015.
(Continued)

*Primary Examiner* — Joseph Schoenholtz
(74) *Attorney, Agent, or Firm* — Muncy, Geissler, Olds & Lowe, P.C.

(57) ABSTRACT

A light-emitting device comprises a substrate having a top surface and a plurality of patterned units protruding from the top surface; and a light-emitting stack formed on the substrate and having an active layer with a first surface substantially parallel to the top surface; wherein one of the plurality of patterned units has a vertex, a first inclined surface, and a second inclined surface, and the first inclined surface and the second inclined surface commonly join at the vertex from a cross-sectional view of the light-emitting device.

20 Claims, 9 Drawing Sheets

Related U.S. Application Data continuation of application No. 12/646,553, filed on Dec. 23, 2009, now Pat. No. 8,633,501, which is a continuation-in-part of application No. 12/222,548, filed on Aug. 12, 2008, now Pat. No. 8,791,029.

(56) References Cited

U.S. PATENT DOCUMENTS

| | | | |
|---|---|---|---|
| 6,870,191 B2 | 3/2005 | Niki et al. | |
| 7,642,561 B2 | 1/2010 | Lee et al. | |
| 7,683,386 B2 | 3/2010 | Tanaka et al. | |
| 7,781,790 B2 | 8/2010 | Minato et al. | |
| 7,968,361 B2 | 6/2011 | Osawa et al. | |
| 8,119,534 B2 | 2/2012 | Tanaka et al. | |
| 8,344,403 B2 | 1/2013 | Niki et al. | |
| 9,257,604 B2* | 2/2016 | Ou | H01L 33/22 |
| 2006/0118802 A1 | 6/2006 | Lee et al. | |
| 2007/0121690 A1 | 5/2007 | Fujii et al. | |
| 2008/0073657 A1* | 3/2008 | Liang | H01L 33/08 257/89 |
| 2009/0014751 A1 | 1/2009 | Kim et al. | |
| 2009/0057700 A1 | 3/2009 | Jin et al. | |
| 2010/0006862 A1* | 1/2010 | Cheng | H01L 33/22 257/79 |
| 2010/0006878 A1 | 1/2010 | Kim et al. | |
| 2011/0263061 A1 | 10/2011 | Kim et al. | |

OTHER PUBLICATIONS

Definition of vertex downloaded from URL <http://www.merriam-webster.com/dictionary/vertex> on Apr. 30, 2015.

Kuo, H.C., "Recent Progress of GaN Based High Power LED", 14$^{th}$ Optoelectronic and Communication Conference, Hong Kong, Jul. 13, 2009.

Chen, J.J., et al., "Enhanced Output Power of GaN-Based LEDs with Nano-Patterned Sapphire Substrates", IEEE Photonics Technology Letters 20.13 (2008): 1193-195.

Su, Yan-Kuin, et al., "GaN-Based Light-Emitting Diodes Grown on Photonic Crystal-Patterned Sapphire Substrates by Nanosphere Lighography", Japanese Journal of Applied Physics 47.8 (2008): 6706-708.

Lee, Jae-Hoon, et al., "Stress Reduction and Enhanced Extraction Efficiency of GaN-Based LED Grown on Cone-Shape-Patterned Sapphire", IEEE Photonics Technology Letters 20.18 (2008): 1563-565.

Definition of polygonal downloaded from URL <http://www.merriam-webster.com/dictionary/polygon> Aug. 23, 2014.

Lin, Hung-Cheng, et al., "Light Output Enhancement of InGaN Light-Emitting Diodes Grown on Masklessly Etched Sapphire Substrates", IEEE Photonics Technology Letters 20.19 (2008): 1621-623.

Oh, Tae Su, et al., "GaN-Based Light-Emitting Diodes on Micro-Lens Patterned Sapphire Substrates", Japanese Journal of Applied Physics 47.7 (2008): 5333-336.

Lee, Jae-Hoon, et al., "Enhancement of InGaN-Based Vertical LED with Concavely Patterned Surface Using Patterned Sapphire Substrates", IEEE Photonics Technology Letters 20.5 (2008): 345-47.

Park, Eun-Hyun, et al., "Air-voids Embedded High Efficiency InGAN-light Emiting Diode", Applied Physics Letters 93.19 (2008): 191103.

* cited by examiner

LIGHT-EMITTING DEVICE HAVING A PATTERNED SURFACE

RELATED APPLICATION

This application is a continuation application of U.S. patent application Ser. No. 14/132,819, entitled "A LIGHT-EMITTING DEVICE HAVING A PATTERNED SURFACE", filed on Dec. 18, 2013, which is a continuation application of U.S. patent application Ser. No. 12/646,553, entitled "A LIGHT-EMITTING DEVICE HAVING A PATTERNED SURFACE", filed on Dec. 23, 2009, which is a continuation-in-part of U.S. patent application Ser. No. 12/222,548, entitled "Stamp Having Nanoscale Structure And Applications Thereof In Light-Emitting Device", filed on Aug. 12, 2008 claiming the right of priority based on TW application Ser. No. 097150633 filed on Dec. 24, 2008; the contents of which are incorporated herein by reference in their entireties.

BACKGROUND

1. Technical Field

The present disclosure relates to a light-emitting device having a patterned surface.

2. Description of the Related Art

Recently, efforts have been devoted to promote the luminance of the light-emitting diode (LED) in order to implement the device in the lighting domain, and further procure the goal of energy conservation and carbon reduction. There are two major aspects to promote luminance. One is to increase the internal quantum efficiency (IQE) by improving the epitaxy quality to enhance the combination efficiency of electrons and holes. The other is to increase the light extraction efficiency (LEE) that emphasizes on the light which is emitted by the light-emitting layer capable of escaping outside the device, and therefore reducing the light absorbed by the LED structure.

Surface roughening technology is one of the efficient methods to enhance luminance. FIG. 7 shows a known LED 700 having a patterned substrate. LED 700 comprises a growth substrate 701, an epitaxial stack, a first electrode 707, and a second electrode 708. The surface 701a of the growth substrate 701 has a plurality of trapezoid depression for improving the light-extraction efficiency. The epitaxial stack comprises a buffer layer 702 grown on the growth substrate, a non-doped semiconductor layer 703 grown on the buffer layer 702, a first semiconductor layer 704 with first conductivity-type grown on the non-doped semiconductor layer 703, an active layer 705 grown on the first semiconductor layer 704, a second semiconductor layer 706 with second conductivity-type grown on the active layer 705. The first electrode 707 is formed on the exposed first semiconductor layer 704, and the second electrode 708 is formed on the second semiconductor layer 706.

The ratio of the pattern width to the width between patterns of the substrate surface 701a is generally designed to be around 1. Therefore, a considerable portion of the substrate surface 701a is still parallel to the surface of the active layer 705a, and the light emitted from the active layer 705 to the parallel substrate surface is easily reflected back to the epitaxial stack because of total internal reflection (TIR) effect and absorbed by the epitaxial stack to generate heat. It worsens both the light extraction efficiency and the heat dissipation problems. Nevertheless, the pattern is usually formed deeper in order to compensate the light loss due to the parallel (unpatterned) region, but the high aspect ratio of the deeper pattern causes difficulty for subsequently epitaxial growth and adversely affects the epitaxial quality.

Another prior technique for roughen surface is to utilize mechanically polishing method to form a randomly distributed rough patterns on the substrate surface. By this method, it is hard to control the roughened dimension, such as the depth or the width. Moreover, the epitaxial quality is not good by growing an epitaxial layer on the randomly rough surface.

SUMMARY OF THE DISCLOSURE

The disclosure provides a light-emitting device. The light-emitting device comprises: a substrate having a first patterned unit; and a light-emitting stack on the substrate and having an active layer with a first surface; wherein the first patterned unit, protruding in a direction from the substrate to the light-emitting stack, has side surfaces abutting with each other and substantially non-parallel to the first surface in cross-sectional view, and has a non-polygon shape in top view.

A light-emitting device includes a substrate having a top surface and a first patterned unit bulged on the top surface; and a light-emitting stack formed on the substrate and having an active layer with a first surface substantially parallel to the top surface; wherein a base of the first patterned unit has a non-polygon shape in a top view, and in a cross-sectional view: the first patterned unit has a vertex, a first inclined line segment, and a second inclined line segment, and the first inclined line segment and the second inclined line segment connect at the vertex.

A light-emitting device includes a substrate having a top surface and a first patterned unit bulged on the top surface; and a light-emitting stack formed on the substrate and having an active layer with a first surface substantially parallel to the top surface, wherein the first patterned unit has a non-polygon shape in a top view, and a first inclined line and a second inclined line directly connect to the top surface to form a vertex in a cross-sectional view, and wherein the first patterned unit is substantially formed in a V-shape in the cross-sectional view.

A light-emitting device includes a substrate having a top surface and a plurality of first patterned units bulged on the top surface; and a light-emitting stack formed on the substrate and having an active layer with a first surface substantially parallel to the top surface, wherein each of the plurality of first patterned units has a non-polygon shape in a top view, and a first inclined line and a second inclined line directly connect to the top surface to form a vertex in a cross-sectional view, and wherein each of the plurality of first patterned units is substantially formed in a V-shape in the cross-sectional view.

A light-emitting device comprises a substrate having a top surface and a plurality of patterned units protruding from the top surface; and a light-emitting stack formed on the substrate and having an active layer with a first surface substantially parallel to the top surface; wherein one of the plurality of patterned units has a vertex, a first inclined surface, and a second inclined surface, and the first inclined surface and the second inclined surface commonly join at the vertex from a cross-sectional view of the light-emitting device.

DETAILED DESCRIPTION OF THE EMBODIMENTS

Figure 1:
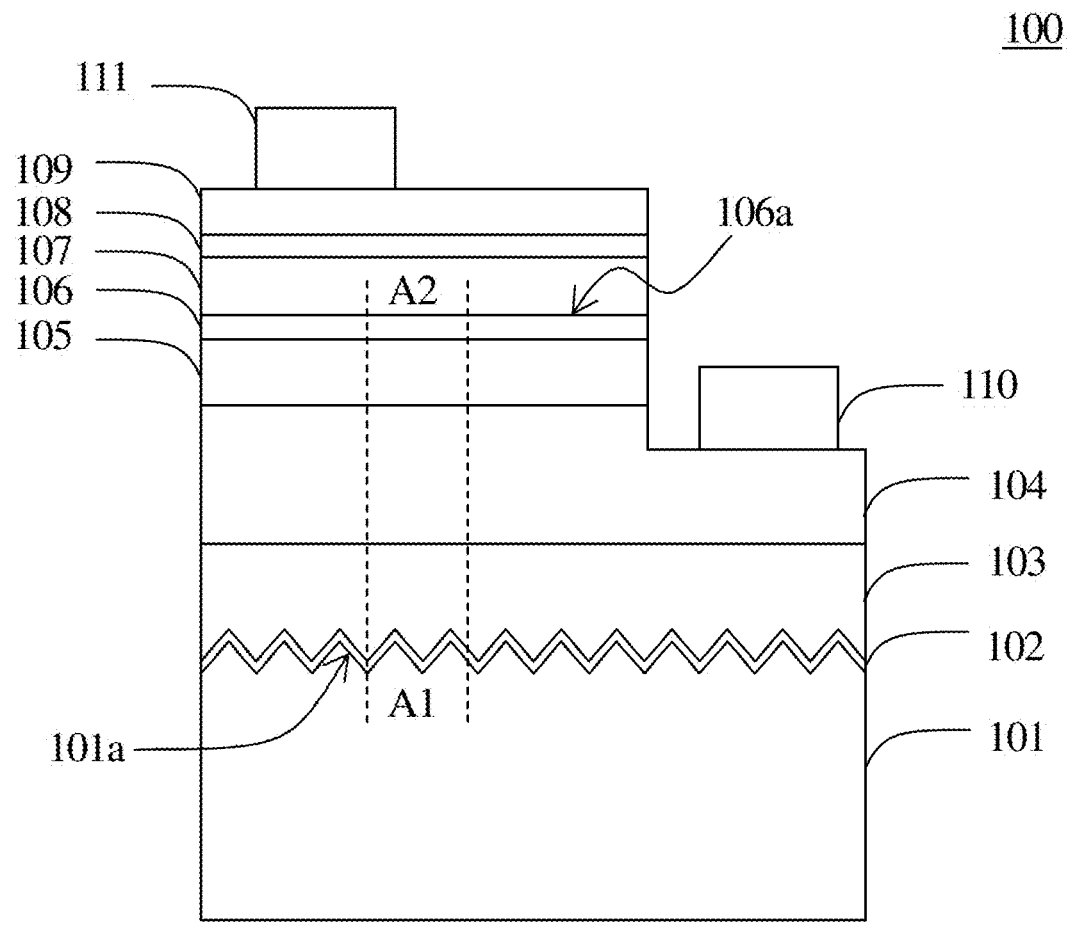
FIG. 1 shows a light-emitting device in accordance with the first embodiment of the present disclosure.

FIG. 1 shows a light-emitting device 100 in accordance with a first embodiment of the present disclosure. The light-emitting device 100 comprises a growth substrate 101, an intermediate layer comprising a buffer layer 102 and/or an undoped semiconductor layer 103 epitaxially grown on the growth substrate 101, a first contact layer 104 with first conductivity-type epitaxially grown on the intermediate layer, a first cladding layer 105 with first conductivity-type epitaxially grown on the first contact layer 104, an active layer 106 epitaxially grown on the first cladding layer 105, a second cladding layer 107 with second conductivity-type epitaxially grown on the active layer 106, a second contact layer 108 with second conductivity-type epitaxially grown on the second cladding layer 107, a current spreading layer 109 formed on the second contact layer 108 and forming an ohmic contact with the second contact layer 108, a first electrode 110 formed on the exposed first contact layer 104 by evaporation or sputtering method, and a second electrode 111 formed on the current spreading layer 109 by evaporation or sputtering method; wherein the growth substrate 101 has a patterned surface 101a comprising a plurality of ordered pattern units, and each of the plurality of ordered pattern units is compactly disposed, for example, at least one of the plurality of pattern units is substantially contacted with the neighboring units. According to the embodiment, any region of the patterned surface 101a, e.g. A1 region, is substantially not parallel to the corresponding region of the surface of the active layer, e.g. A2 region. The plurality of the ordered pattern units is disposed in a fixed period, variable period, or quasi-period. The top views of the plurality of pattern units comprise a polygon, or at least one pattern selected from the group consisting of triangle, rectangle, hexagon, and circle. The cross-sections of the plurality of pattern units comprise at least one pattern selected from the group consisting of V-shape, semicircle, arc, and polygon. Each of the plurality of pattern units has a width and a depth, and the depth is preferable less than the width for facilitating the subsequently grown buffer layer 102 and/or the undoped semiconductor layer 103 to fill into the depressed region of the patterned surface 101a.

Figure 2:
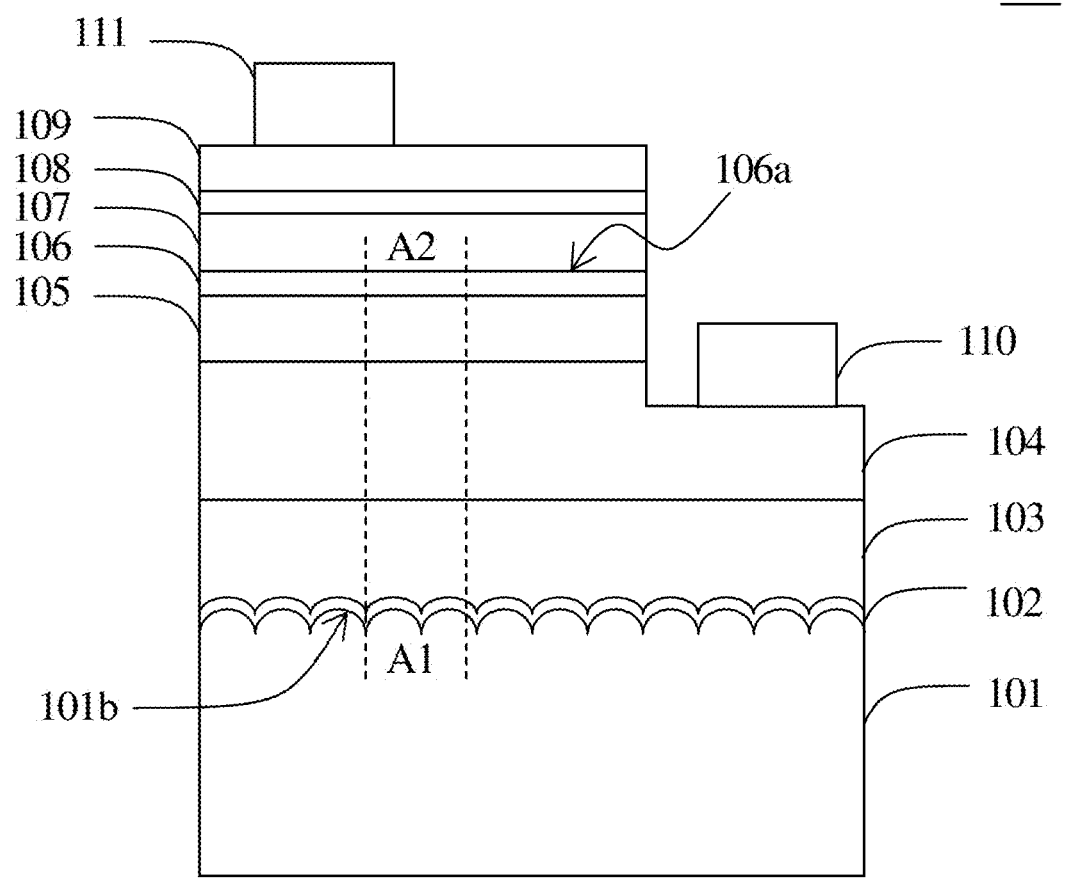
FIG. 2 shows a light-emitting device in accordance with the second embodiment of the present disclosure.

FIG. 2 shows a light-emitting device 200 in accordance with a second embodiment of the present disclosure. In comparison with the light-emitting device 100 shown in FIG. 1, the cross-section of the patterned surface 101b comprises a plurality of ordered patterned units, and each of the patterned units comprises a smooth curve for facilitating the subsequently grown buffer layer 102 and/or the undoped semiconductor layer 103 to fill into the depressed area of the patterned surface 101b. The method for forming the cross-section with a smooth curve comprises firstly forming a mask layer of photoresist on a plane substrate, patterning the mask layer by lithographic process, then curing the patterned mask layer in a baking machine under an appropriate temperature to reflow the patterned mask layer of photoresist to form a profile with smooth curve, finally dry-etching or wet-etching the substrate with the patterned mask layer to transfer the smooth curve profile to the substrate to form a patterned surface 101b with a smooth curve as shown in FIG. 2. The top views of the plurality of pattern units comprise polygon, or at least one pattern selected from the group consisting of triangle, rectangle, hexagon, and circle.

Figure 3A:
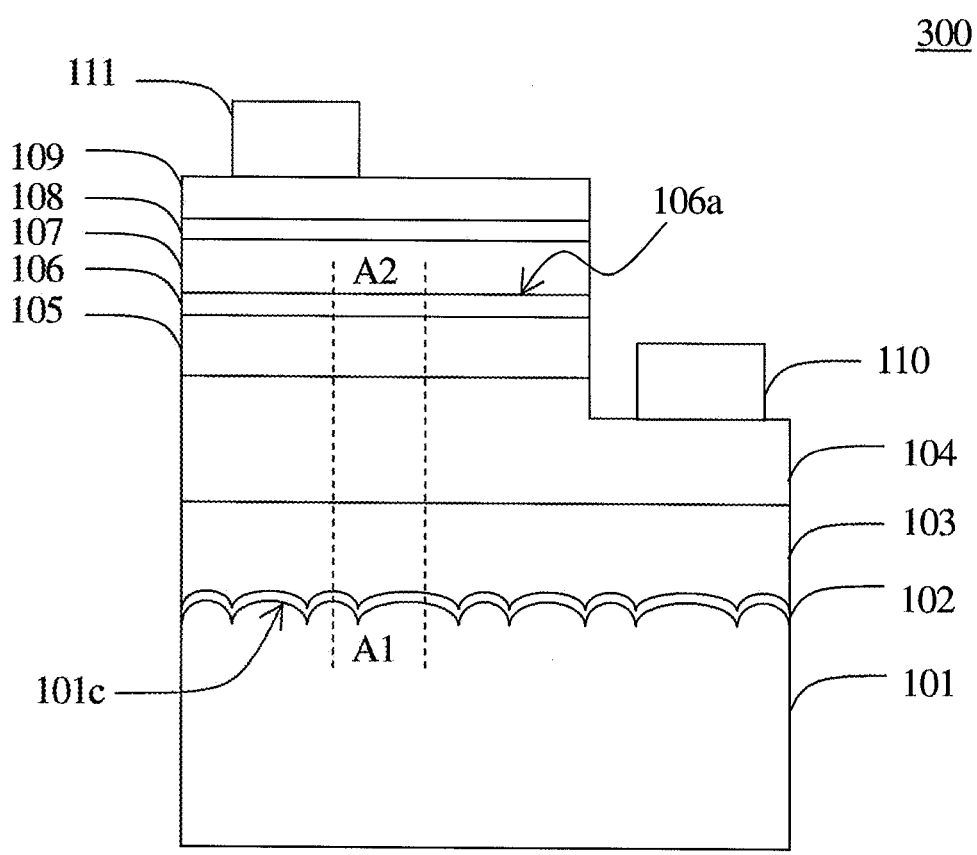
FIGS. 3A and 3B show a light-emitting device in accordance with the third embodiment of the present disclosure.
Figure 3B:
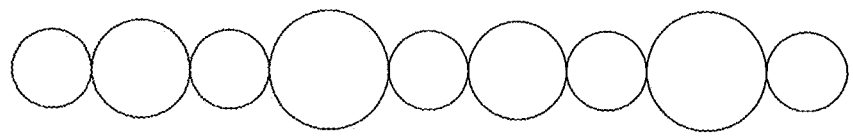

FIGS. 3A and 3B show a light-emitting device 300 in accordance with a third embodiment of the present disclosure. In comparison with the light-emitting device 200 shown in FIG. 2, the patterned surface 101c of the light-emitting device 300 comprises a plurality of patterned units with variable dimensions or variable patterns disposed in a fixed period, variable period, or quasi-period. The top views of the plurality of the patterned units comprise polygon, or at least one pattern selected from the group consisting of triangle, rectangle, hexagon, and circle. In this embodiment, FIG. 3A shows the cross-section of the plurality of patterned units comprises at least two curves with different curvatures. FIG. 3B shows the patterned units have circular shapes with different diameters or different areas in the top view.

Figure 4:
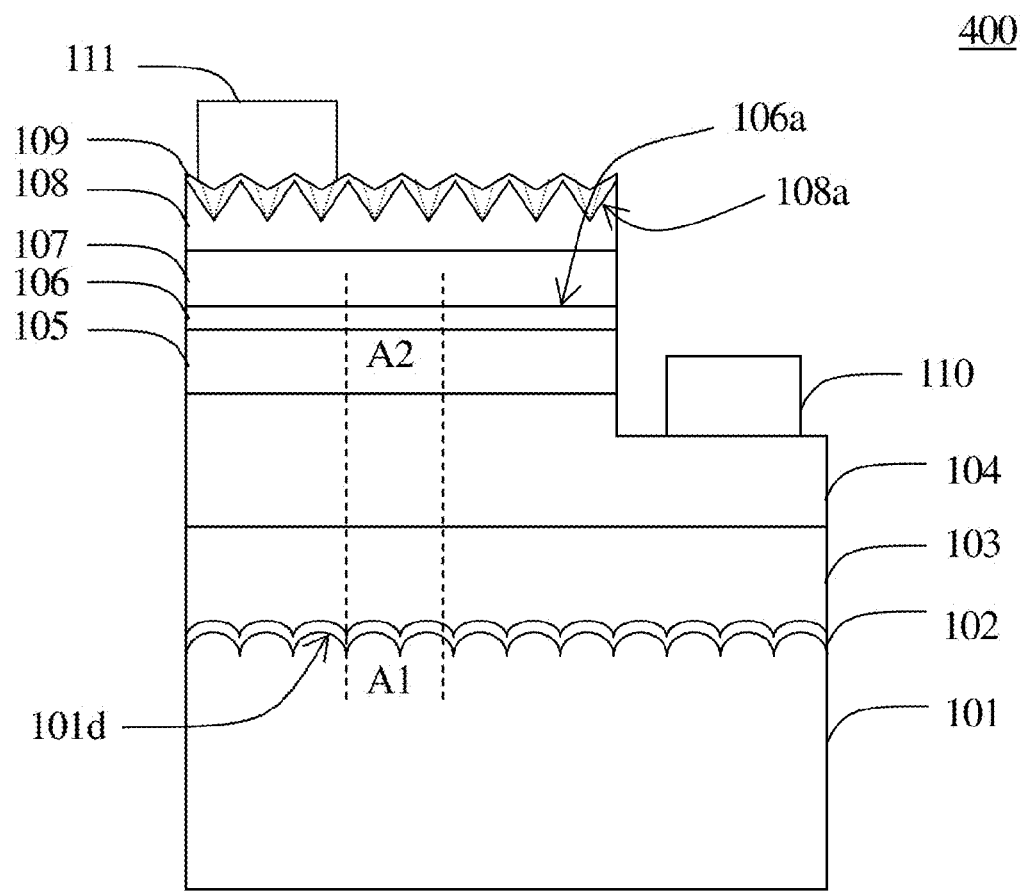
FIG. 4 shows a light-emitting device in accordance with the fourth embodiment of the present disclosure.

FIG. 4 shows a light-emitting device 400 in accordance with a fourth embodiment of the present disclosure. In comparison with the light-emitting device 200 shown in FIG. 2, the second contact layer 108 of the light-emitting device 400 further comprises an exterior surface 108a having the patterned surface as disclosed in the foregoing embodiments for further enhancing the light extraction efficiency, and any region of the patterned surface 108a is substantially not parallel to the corresponding region of the upper surface 106a of the active layer. The method for forming the exterior surface 108a of the second contact layer 108 comprises naturally growing the second contact layer 108 with hexagonal depressions by adjusting the epitaxial growth parameters, such as lowering the growth temperature, or changing the gas concentration ratio of Hydrogen to Nitrogen, or performing a traditional lithographic and etching process to form the patterned surface 108a with protrusions and/or depressions. The subsequently formed current spreading layer 109 is conformable with the patterned surface 108a and forms a good ohmic contact with the second contact layer 108.

Figure 5:
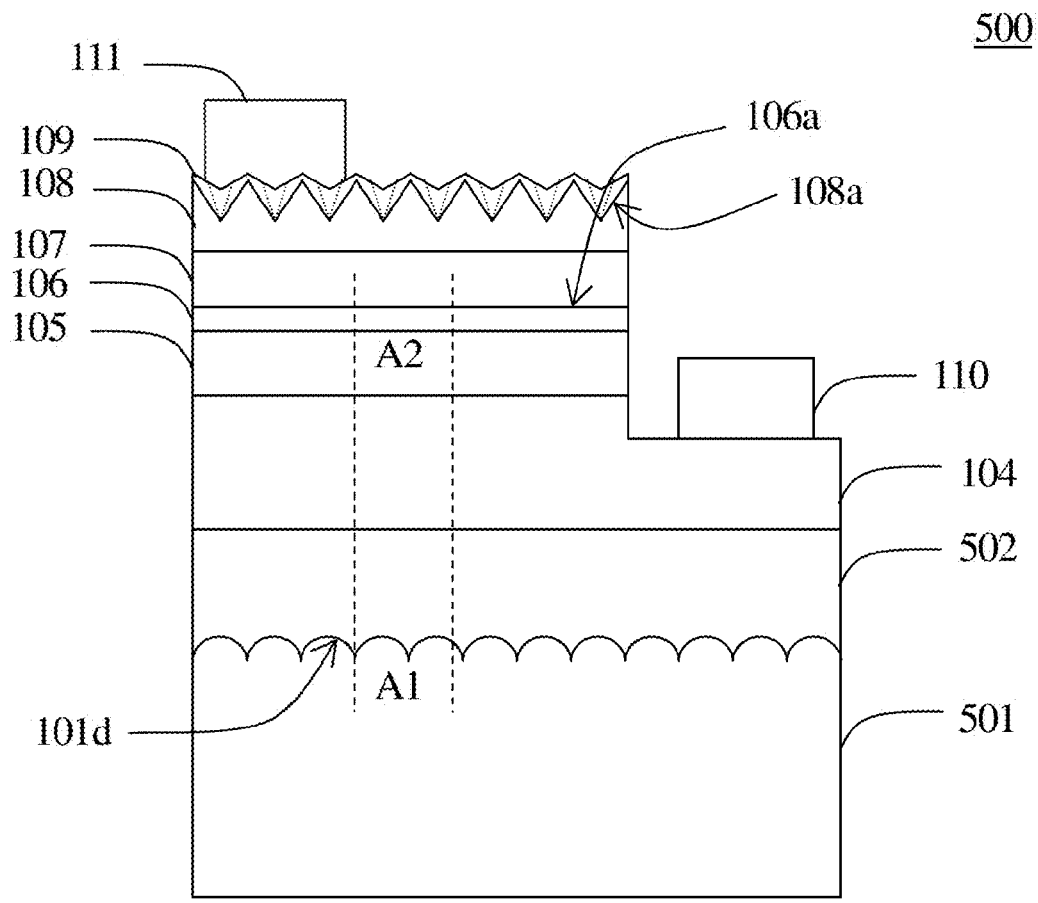
FIG. 5 shows a light-emitting device in accordance with the fifth embodiment of the present disclosure.

FIG. 5 shows a light-emitting device 500 in accordance with a fifth embodiment of the present disclosure. In comparison with the light-emitting device 200 shown in FIG. 2, the intermediate layer 502 of the light-emitting device 500 comprises a bonding layer, e.g. a transparent adhesive layer or a transparent conductive layer. The first contact layer 104 is joined to the second substrate 501 by a bonding technique, e.g. a direct bonding method or a thermo-compression bonding method. According to the present disclosure, the second substrate 501 is not limited to a material for epitaxial growth, and is flexible as long as the material meets the purpose, e.g. a material with high conductivity, a material with high transparency, a conductive material, or a material with high reflectivity.

Figure 6A:
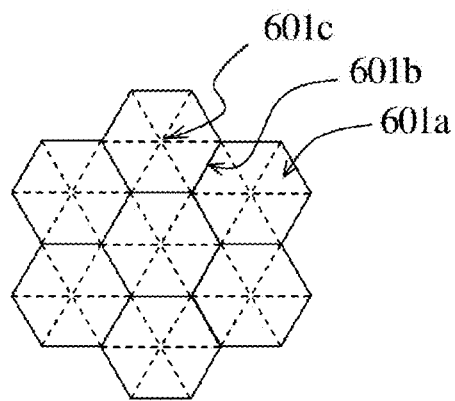
FIG. 6A to 6E show embodiments of the top views of the patterned surface in accordance with the present disclosure.
Figure 6B:
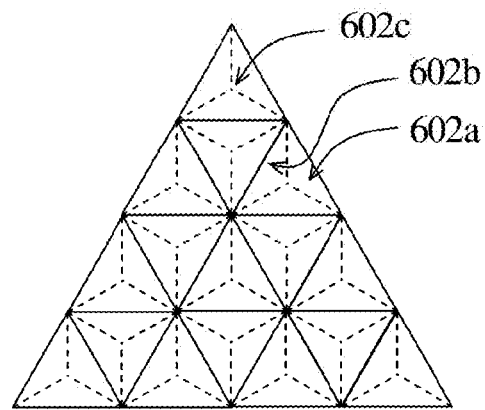
Figure 6C:
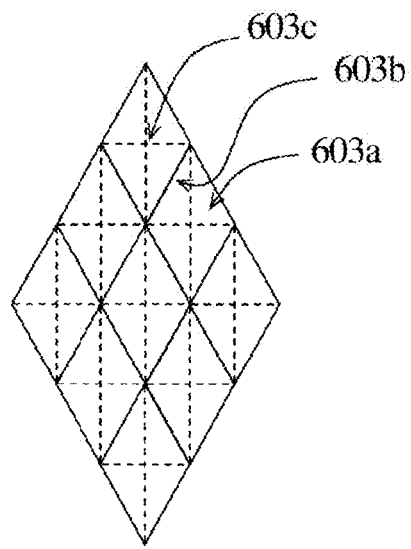
Figure 6D:
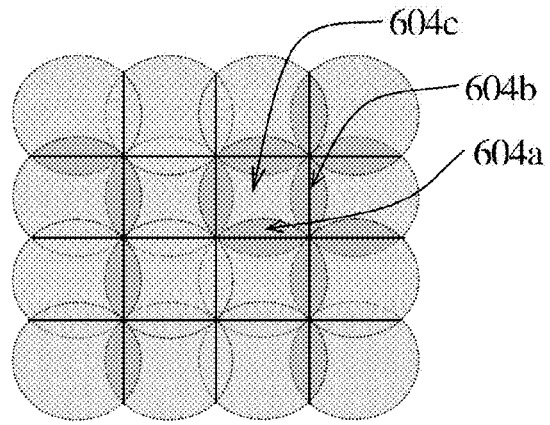
Figure 6E:
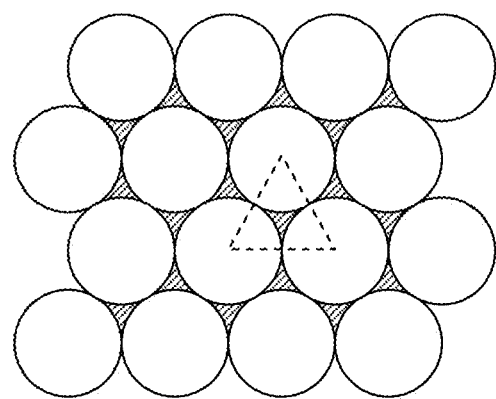
Figure 7:
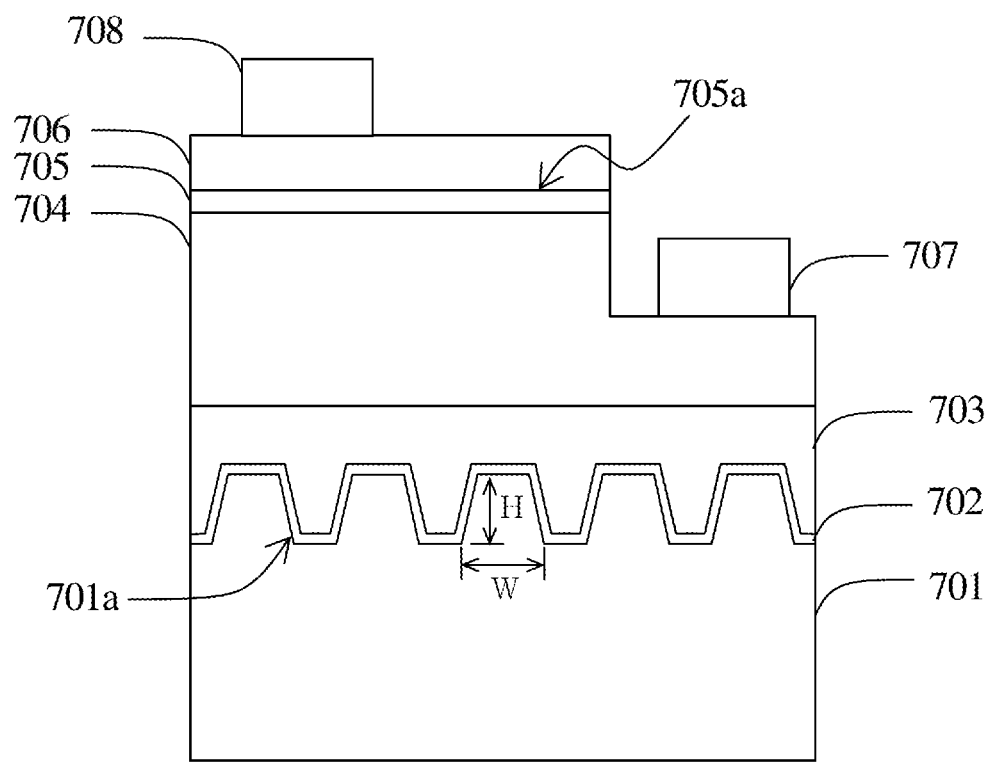
FIG. 7 shows a known structure of a light-emitting diode.

FIG. 6A to FIG. 6D shows the top views of the patterned surface in accordance with the present disclosure. As shown in FIG. 6A, the patterned surface comprises a plurality of hexagonal pattern units. Each of the pattern units is composed of six inclined surfaces 601a depressed or protruded from the substrate. The six inclined surfaces 601a are commonly joined at a vertex 601c, and mutually joined at six connecting sides 601b such that the patterned surface of the substrate is substantially not parallel to the corresponding region of the upper surface 106a of the active layer. As shown in FIG. 6B, the patterned surface comprises a plurality of triangular pattern units. Each of the pattern units is composed of three inclined surfaces 602a depressed or protruded from the substrate. The three inclined surfaces 602a are commonly joined at a vertex 602c, and mutually joined at three connecting sides 602b such that the patterned surface of the substrate is substantially not parallel to the corresponding region of the upper surface 106a of the active layer. As shown in FIG. 6C, the patterned surface comprises a plurality of rhombus pattern units. Each of the pattern units is composed of four inclined surfaces 603a depressed or protruded from the substrate. The four inclined surfaces 603a are commonly joined at a vertex 603c, and mutually joined at four connecting sides 603b such that the patterned surface of the substrate is substantially not parallel to the corresponding region of the upper surface 106a of the active layer. As shown in FIG. 6D, the patterned surface comprises a plurality of square pattern units defined by overlapped circles. Each of the pattern units is composed of four inclined surfaces 604a protruded from the substrate and a rounded top surface 604c. The plurality of pattern units are mutually joined at the connecting sides 604b such that the patterned surface of the substrate is substantially not parallel to the corresponding region of the upper surface 106a of the active layer. The statement of "the patterned surface of the substrate is substantially not parallel to the corresponding region of the upper surface of the active layer" as described in the foregoing embodiments does not exclude the circumstances caused by the various process deviations, such as the photoresist pattern distortion by lithographic deviation or pattern distortion by etching deviation such that portion of the to-be-patterned surface is not patterned or portion of the patterned region still comprises surface parallel to the active layer. For example, the vertices 601c, 602c, 603c, or rounded top surface 604c still possibly comprises a small mesa under the various process deviations, but the process deviations are preferred to be controlled to have the total surface area that is parallel to the active layer and the total surface area of the unpatterned surface do not exceed 3% of the total substrate area. As shown in FIG. 6E, the patterned surface comprises a plurality of circular pattern units. Each of the pattern units is disposed side by side in a tightest disposition such that the patterned surface area of the substrate that is parallel to the corresponding region of the upper surface 106a of the active layer is about 9.3% or not over 10% of the total substrate area, i.e. the ratio of the area of the triangular area subtracting the area of the three sectors to the area of the triangular area is about 9.3% or not over 10%.

The pattern units as disclosed in the foregoing embodiments have a relative higher patterned proportion, therefore increase the difficulty to epitaxially grow the subsequently buffer layer and the undoped semiconductor layer. In order to fulfill both light extraction efficiency and internal quantum efficiency, the cross-section of each of the pattern units has a width and a depth smaller than the width, i.e. the ratio of the depth to the width is lower than 1, therefore a pattern unit with a lower aspect ratio is achieved. The subsequently epitaxially grown buffer layer and/or the undpoded semiconductor layer are easily filled into the depressed region of the patterned surface to enhance the epitaxial growth quality.

The patterned surface described in the above-mentioned embodiments is not limited to be formed on any surface of any specific structure of the light-emitting device in accordance with the present disclosure. It is still under the scope of the disclosure to form the patterned surface on any structure of the light-emitting device in accordance with the present disclosure. For example, the patterned surface can be formed on the light output surface of the light-emitting device contacting with the surroundings. The neighboring materials neighbored to the patterned structure includes but not limited to any structure of the light-emitting device, the encapsulating material, or the environmental medium having a different refraction index from the patterned structure. The difference of the refraction indexes of the patterned structure and the neighboring material is at least 0.1.

The materials of the buffer layer, the undoped semiconductor layer, the first contact layer, the first cladding layer, the second cladding layer, the second contact layer, and the active layer comprise III-V compound materials, e.g. $Al_pGa_qIn_{1-p-q}P$ or $Al_xIn_yGa_{(1-x-y)}N$, wherein, $0 \leq p, q, x, y \leq 1$; $(p+q) \leq 1$; $(x+y) \leq 1$. The first conductivity-type comprises n-type or p-type. The second conductivity-type comprises n-type or p-type and is different to the first conductivity-type. The current spreading layer comprises metal oxide, e.g. ITO, or well-conductive semiconductor layer of phosphide or nitride having high impurity concentration. The growth substrate comprises at least one material selected from the group consisting of GaP, sapphire, SiC, GaN, and MN. The second substrate comprises a transparent material selected from the group consisting of GaP, sapphire, Sic, GaN, and MN, or a heat dissipating material selected from the group consisting of diamond, diamond-like-carbon (DLC), ZnO, Au, Ag, Al, and other metals.

It will be apparent to those having ordinary skill in the art that various modifications and variations can be made to the methods in accordance with the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A light-emitting device comprising:
    a substrate having a top surface and a plurality of patterned units protruding from the top surface of the substrate; and
    a light-emitting stack formed on the substrate and having an active layer with a first surface substantially parallel to the top surface of the substrate,
    wherein one of the plurality of patterned units comprises a plurality of connecting sides constituting a polygon shape in a top view of the light-emitting device, and
    wherein the one of the plurality of patterned units comprises a vertex and a plurality of inclined surfaces respectively extending from the plurality of connecting sides, the plurality of inclined surfaces commonly join at the vertex in a cross-sectional view of the light-emitting device, the vertex being between the top surface of the substrate and the first surface of the active layer.

2. The light-emitting device according to claim 1, wherein the plurality of inclined surfaces is substantially not parallel to the first surface of the active layer.

3. The light-emitting device according to claim 1, wherein the one of the plurality of patterned units comprises a triangular shape in a cross-sectional view of the light-emitting device.

4. The light-emitting device according to claim 1, wherein the one of the plurality of patterned units comprises a width and a depth smaller than the width.

5. The light-emitting device according to claim 1, wherein the one of the plurality of patterned units contacts with another one of the plurality of patterned units.

6. The light-emitting device according to claim 1, wherein the polygon shape comprises a triangle, a rectangle, or a hexagon.

7. A light-emitting device comprising:
a substrate having a top surface and a plurality of patterned units protruding from the top surface of the substrate; and
a light-emitting stack formed on the substrate and having an active layer with a first surface substantially parallel to the top surface of the substrate,
wherein one of the plurality of patterned units comprises a plurality of connecting sides constituting a polygon shape in a top view of the light-emitting device, and
wherein the one of the plurality of patterned units comprises a vertex and a plurality of inclined surfaces respectively extending from the plurality of connecting sides, the plurality of inclined surfaces commonly joining at the vertex and the plurality of inclined surfaces comprising a triangular shape.

8. The light-emitting device according to claim 7, wherein the plurality of inclined surfaces is substantially not parallel to the first surface of the active layer.

9. The light-emitting device according to claim 7, wherein the one of the plurality of patterned units comprises a triangular shape in a cross-sectional view of the light-emitting device.

10. The light-emitting device according to claim 7, wherein the plurality of patterned units is periodically arranged on the substrate.

11. The light-emitting device according to claim 7, further comprising an undoped semiconductor layer formed on the substrate and enclosing the plurality of patterned units.

12. The light-emitting device according to claim 7, wherein one of the plurality of patterned units comprises a width and a depth smaller than the width.

13. The light-emitting device according to claim 7, wherein the substrate comprises a non-patterned area parallel to the first surface and the non-patterned area is not greater than 10% of a total area of the substrate.

14. The light-emitting device according to claim 7, further comprising a neighboring material with a refraction index different from that of the substrate.

15. The light-emitting device according to claim 7, wherein the one of the plurality of patterned units contacts with another one of the plurality of patterned units.

16. The light-emitting device according to claim 7, wherein the polygon shape comprises a triangle, a rectangle, or a hexagon.

17. The light-emitting device according to claim 7, wherein the plurality of patterned units comprises at least two curves with different curvatures from a cross-sectional view of the light-emitting device.

18. A light-emitting device comprising:
a substrate having a top surface and a plurality of patterned units protruding from the top surface of the substrate; and
a light-emitting stack formed on the substrate and having an active layer with a first surface substantially parallel to the top surface of the substrate,
wherein the plurality of patterned units comprises a circular shape in a top view of the light-emitting device,
wherein one of the plurality of patterned units comprises two curves with different curvatures in a cross-sectional view of the light-emitting device.

19. The light-emitting device according to claim 18, wherein the plurality of patterned units comprises different areas in the top view of the light-emitting device.

20. The light-emitting device according to claim 18, wherein the plurality of patterned units comprises circular shape with different diameters.

* * * * *